United States Patent
Sumiyoshi (10) Patent No.: US 8,477,286 B2
(45) Date of Patent: Jul. 2, 2013

(54) PROJECTION OPTICAL SYSTEM, EXPOSURE APPARATUS, AND DEVICE MANUFACTURING METHOD

(75) Inventor: Yuhei Sumiyoshi, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 312 days.

(21) Appl. No.: 12/720,080

(22) Filed: Mar. 9, 2010

(65) Prior Publication Data
US 2010/0225889 A1 Sep. 9, 2010

(30) Foreign Application Priority Data

Mar. 9, 2009 (JP) .................. 2009-054815

(51) Int. Cl.
G03B 27/68 (2006.01)
G03B 27/32 (2006.01)

(52) U.S. Cl.
USPC .............................. 355/52; 355/77

(58) Field of Classification Search
None
See application file for complete search history.

(56) References Cited

U.S. PATENT DOCUMENTS 6,104,472 A * 8/2000 Suzuki ........................... 355/53

FOREIGN PATENT DOCUMENTS

JP 10-242048 A 9/1998

* cited by examiner

Primary Examiner — Peter B Kim
Assistant Examiner — Michelle Iacoletti
(74) Attorney, Agent, or Firm — Rossi, Kimms & McDowell LLP (57) ABSTRACT

A projection optical system is configured to project an image of an object plane onto an image plane, and includes a first optical element having an aspheric shape that is rotationally asymmetric with respect to an optical axis, a moving unit configured to move the first optical element in a direction perpendicular to the optical axis, and a second optical element fixed on the optical axis, and configured to reduce an optical path length difference caused by an aspheric surface of the first optical element, the second optical element having no aspheric shape complement to the aspheric shape of the first optical element.

12 Claims, 12 Drawing Sheets

PROJECTION OPTICAL SYSTEM, EXPOSURE APPARATUS, AND DEVICE MANUFACTURING METHOD

BACKGROUND OF THE INVENTION

1. Field of the Invention

The present invention relates to a projection optical system, an exposure apparatus, and a device manufacturing method.

2. Description of the Related Art

Japanese Patent Application No. ("JP") 10-242048 proposes a method for controlling an aberration of a projection optical system in an exposure apparatus by shifting each of a pair of optical elements (in an Alvarez lens) in a direction perpendicular to an optical axis, where the pair of optical elements have complement aspheric surfaces facing each other and are separated by a fine gap in the Alvarez lens.

However, in JP 10-242048, the fine gap between the pair of optical elements causes an aberration. For example, the gap of 100 μm between the pair of optical elements causes non-negligible amounts of distortion and astigmatism but it is difficult to further reduce the gap between them. In other words, the conventional exposure apparatus using the pair of optical elements causes an aberration and deteriorates the overlay accuracy.

SUMMARY OF THE INVENTION

The present invention provides a projection optical system that restrains an aberration, an exposure apparatus, and a device manufacturing method.

A projection optical system according to one aspect of the present invention is configured to project an image of an object plane onto an image plane, and includes a first optical element having an aspheric surface that is rotationally asymmetric with respect to an optical axis, a moving unit configured to move the first optical element in a direction perpendicular to the optical axis, and a second optical element fixed on the optical axis, and configured to reduce an optical path difference caused by an aspheric surface of the first optical element. The second optical element not has aspheric surface complement to the aspheric surface of the first optical element.

Further features of the present invention will become apparent from the following description of exemplary embodiments with reference to the attached drawings.

DESCRIPTION OF THE EMBODIMENTS

Figure 1:
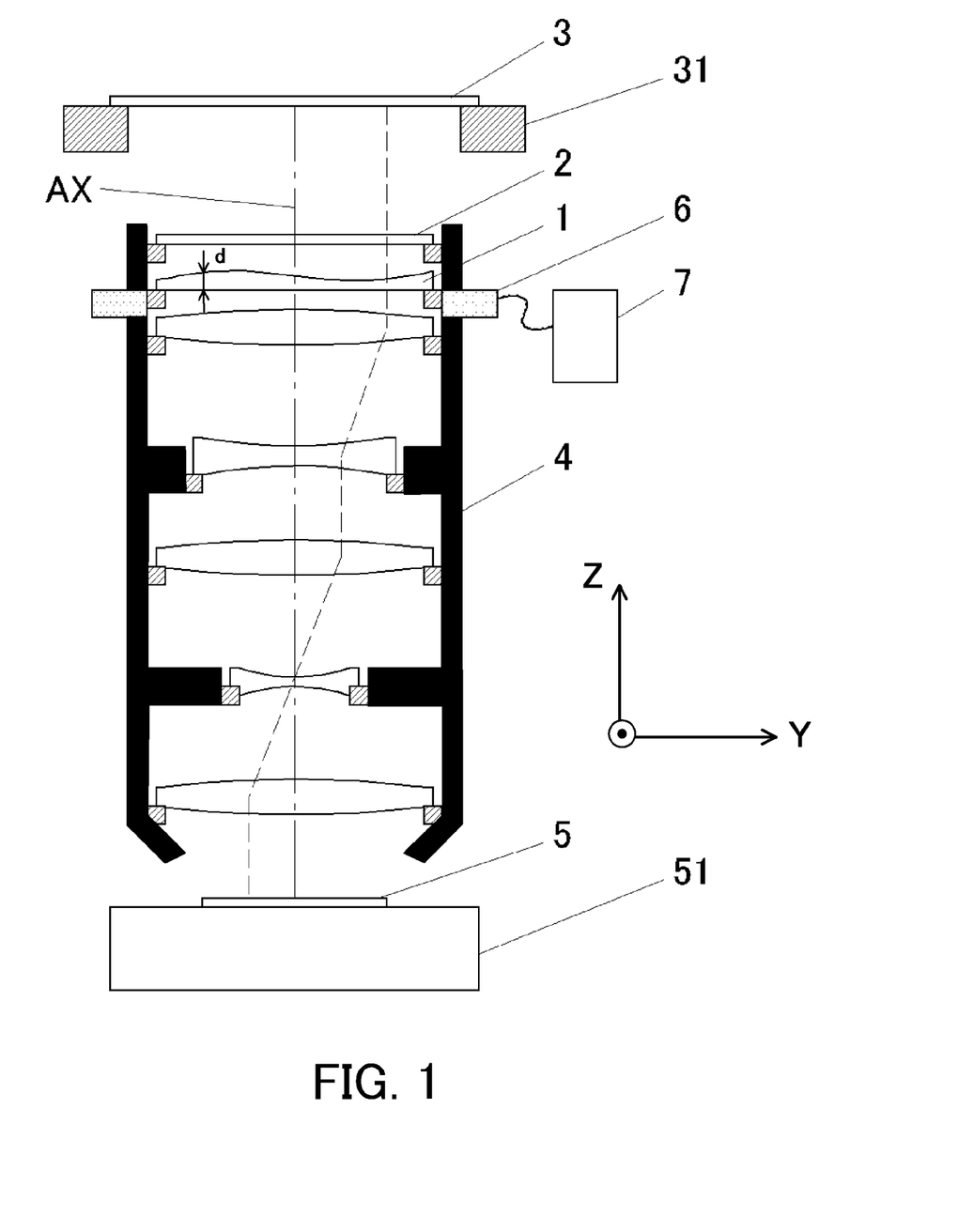
FIG. 1 is a sectional view of an exposure apparatus of this embodiment.

FIG. 1 is a partially sectional view of an exposure apparatus of this embodiment. The exposure apparatus exposes an image of a pattern of an original (mask or reticle) 3 onto a substrate (such as a wafer or a liquid crystal display) 5 utilizing light from a light source (not shown) and an illumination optical system. The exposure apparatus includes an original stage 31 configured to support and drive an original 3, a projection optical system 4 configured to project an image of a pattern of the original 3 located on an object plane onto a substrate 5 located on an image plane, and a substrate stage 51 configured to support and drive the substrate 5.

The projection optical system 4 has an optical axis AX and houses a plurality of optical elements in a (lens) barrel. A plurality of optical elements includes a movement member (first optical element) 1 and a correction member (second optical element) 2. The projection optical system 4 shown in FIG. 1 is, but not limited to, a dioptric optical system and may be a catadioptric optical system, etc.

The projection optical system 4 includes the movement member 1 and the correction member 2, restrains a static aberration in the initial state, and moves the movement member 1 in a direction perpendicular to the optical axis AX, so as to change at least one optical characteristic.

The movement member 1 is held by a movement unit 6 and configured movable in the x and y directions perpendicular to the optical axis AX of the projection optical system. The movement unit 6 is controlled by a controller 7, which is configured to operate a proper movement amount of the movement member 1 based on ambient environment information, exposure load information, a measurement value of an optical characteristic, and user input information, and to move the movement member 1.

The movement member 1 has an aspheric surface that is rotationally asymmetrical with respect to the optical axis AX on a first plane relative to a plane-parallel plate having no substantial optical power. The aspheric surface may be added to a second surface or both surfaces. The movement member 1 is, but not limited to, a transparent optical element in this embodiment.

For example, the movement member 1 has an aspheric surface expressed by the following equation, where C is a constant. Therefore, as the movement member 1 is moved parallel to the y axis, an anisotropic magnification or a magnification component that enlarges or reduces only in a direction parallel to the y axis can be changed. In addition, a variation amount of the magnification component is proportional to a movement amount of the movement member 1. In other words, the variation amount of the anisotropic magnification component can be made continuously variable in accordance with the movement amount of the movement member 1. Of course, the aspheric surface is not limited to that defined by the Equation 1.

$$f(x,y) = C \cdot y^3 \qquad \text{EQUATION 1}$$

As shown in FIG. 1, a z axis is set parallel to the optical axis AX, and the x axis and y axis are set orthogonal to the z axis. Then, a thickness of the movement member 1 can be expressed as a function d(x, y) of x and y. Assume that n is a refractive index of the movement member 1. Then, the optical path length difference of a ray that perpendicularly passes the movement member 1 can be expressed as (n−1)·d where an aspheric amount is not so large and the refraction effect is negligible. Thus, the movement member 1 acts like a phase object that provides an optical path length difference proportional to d(x, y) relative to a perpendicularly incident plane wave.

When the movement member is moved by Δx in the x direction and Δy in the y direction, a thickness d' of the movement member 1 at a coordinate (x, y) after the movement can be expressed as follows:

$$d'(x,y)=d(x-\Delta x, y-\Delta y) \quad \text{EQUATION 2}$$

When the Equation 2 is Taylor-expanded and the quadratic and higher terms are small and ignored, the following equation is obtained. Here, dx(x, y) represents a partial differentiation of d(x, y) using x, and dy(x, y) represents a partial differentiation of d(x, y) using y.

$$d'(x,y)=d(x,y)-\Delta x \cdot dx(x,y)-\Delta y \cdot dy(x,y) \quad \text{EQUATION 3}$$

A difference Δd between the pre-movement thickness and the post-movement thickness can be expressed as follows:

$$\Delta d(x,y)=-\Delta x \cdot dx(x,y)-\Delta y \cdot dy(x,y) \quad \text{EQUATION 4}$$

The optical path length difference between the pre-movement and the post-movement proportional to the Equation 4 can be provided by moving the movement member 1 in the direction perpendicular to the optical axis. The thickness d(x, y) of the movement member 1 can make adjustable a variety of types of optical characteristics. A suitable aspheric surface can provide a predetermined aberration adjustment effect.

A position of the movement member 1 is a parameter to adjust a type of the optical characteristic to be controlled. For example, when a projection optical system has a reduction magnification and the movement member 1 is provided near the original, the magnification and the distortion can be made variable without significantly changing other aberrations. On the other hand, when the movement member 1 is provided near the substrate, the spherical aberration and the astigmatism can be made variable together with the magnification and the distortion. When the movement member is provided near the pupil of the projection optical system, a wavefront aberration component that is uniform in the screen can be made variable without significantly changing the magnification and the distortion. At this time, since a shape of the variable component of the wavefront aberration depends upon the aspheric surface of the movement member, the spherical aberration and the astigmatism, etc. can be arbitrarily set. The position of the movement member 1 can be determined in accordance with the optical characteristic to be varied since there is a setting position suitable for a control, such as a curvature of field or astigmatism. This embodiment arranges the movement member 1 on a telecentric optical path close to the original 3.

The correction member (second optical element) 2 is fixed on the optical axis, and reduces the optical path length difference that occurs due to the aspheric surface of the movement member 1. The correction member 2 may correct a high order term that does not appear in the approximate optical path length difference (n−1)·d that occurs as a result of that the aspheric surface is added to the movement member 1. The correction member 2 of this embodiment is, but not limited to, a transparent optical element.

The number of the correction members 2 is not limited, but a plurality of correction members 2 can generally provide a more effective aberration correction capability than a single correction member 2. In addition, a position of the correction member 2 is not limited, but this embodiment arranges the correction movement member 2 closer to the movement member 1 because an aberration correction generally becomes easier in that case. The correction member 2 may be arranged closer to the substrate 5 than the movement member 1.

The correction member 2 includes an optical element having an aspheric surface, a diffraction optical element, and an optical element having a refractive index distribution, and provides an optical path length difference. The correction member 2 may be an optical element having a power and may correct the optical path length difference through parallel decentering, inclination decentering, etc. In this embodiment, the correction member 2 is a transparent optical element having an aspheric surface on either a first surface or a second surface or both of the first surface and the second surface, and the aspheric surface is not complement (or is non-complement) to the aspheric surface of the movement member 1, and thus the movement member 1 and the correction member 2 do not constitute an Alvarez lens.

In determining the aspheric surface of the correction member 2, the aspheric surface of the movement member 1 is determined in accordance with the Equation 4 using information of the optical characteristic to be varied and the information of the movement amount of the movement member. Thereafter, so as to minimize the aberration that occurs due to the aspheric surface of the movement member 1, aspheric coefficients of the correction member 2 are obtained through the optimization, etc. At this time, use of a spot diagram, a distortion, and a wavefront aberration for a target of the optimization is effective. In addition, it is effective to use a rotationally asymmetrical component, such as a coefficient of each term developed in the Zernike polynomial and a coefficient of each term of the developed x and y power polynomial, for an aspheric coefficient of the correction member 2 used for the variable of the optimization. The optimization can be provided by an automatic design function incorporated into universal optical design software.

This embodiment incorporates the movement member 1 and the correction member 2 into the barrel of the projection optical system 4, but both and the movement unit 6 may be incorporated into the original stage 31, thereby further restraining the fluctuation of the aberration component other than the magnification and the distortion when the movement member 1 is moved.

In exposure, an illumination optical system (not shown) uniformly illuminates an original using light from a light source, and the projection optical system projects diffracted light that reflects the original pattern onto the substrate. Since the aberration of the projection optical system is well corrected, high quality exposure can be provided.

A device (such as a semiconductor integrated circuit device and a liquid crystal display device) is manufactured by the step of exposing a photosensitive agent applied substrate (such as a wafer and a glass plate) using the above exposure apparatus, by developing the substrate, and by other known steps (device manufacturing method).

First Embodiment

Figure 2:
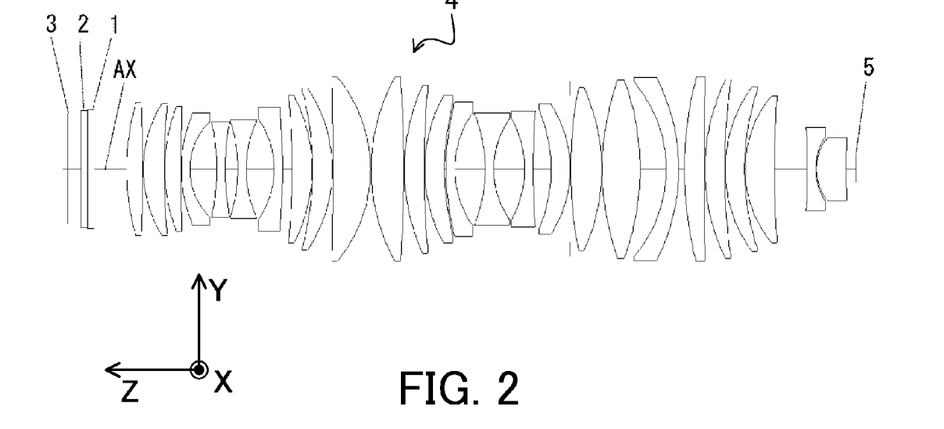
FIG. 2 is a sectional view showing a specific structural illustration of a plurality of optical elements applicable to a projection optical system shown in FIG. 1 (first embodiment).

FIG. 2 is a sectional view of a specific structure (first embodiment) of a plurality of optical elements included in the projection optical system 4. The projection optical system 4 of the first embodiment is used for a light source of a KrF excimer laser having a wavelength of 248 nm, and has a NA of 0.65 and a projection magnification of −¼ times. The substrate 5 has a rectangular exposure area of 26×33 mm. Table A shows an effective diameter, a radius of curvature, a surface separation (surface distance), and a glass type of each surface of the projection optical system 4.

TABLE A

| Surface Number | | Effective Diameter | Radius of Curvature | Surface Separation | Glass Type |
|---|---|---|---|---|---|
| 1 | | 168.4 | ∞ | 20.000 | |
| 2 | | 175.1 | ∞ | 10.000 | SiO2 |
| 3 | XY | 177.3 | ∞ | 0.100 | |
| 4 | XY | 177.3 | ∞ | 10.000 | SiO2 |
| 5 | | 179.6 | ∞ | 49.900 | |
| 6 | | 201.1 | 360.35595 | 24.239 | SiO2 |
| 7 | | 201.2 | −2626.12645 | 1.000 | |
| 8 | ASP | 200.9 | 194.69048 | 31.899 | SiO2 |
| 9 | | 197.6 | 1033.39423 | 1.000 | |
| 10 | | 190.2 | 263.76738 | 24.000 | SiO2 |
| 11 | | 185.3 | 2469.14371 | 1.000 | |
| 12 | | 169.8 | 213.75001 | 13.000 | SiO2 |
| 13 | | 145.8 | 100.99769 | 40.816 | |
| 14 | | 145.0 | −345.07487 | 13.000 | SiO2 |
| 15 | | 141.6 | 380.61350 | 19.072 | |
| 16 | | 141.6 | −245.45695 | 13.000 | SiO2 |
| 17 | | 149.7 | 177.13340 | 42.407 | |
| 18 | | 151.6 | −132.64449 | 13.000 | SiO2 |
| 19 | ASP | 187.3 | −614.48492 | 14.667 | |
| 20 | | 214.1 | −1097.46560 | 30.000 | SiO2 |
| 21 | | 223.4 | −242.75498 | 1.000 | |
| 22 | | 238.5 | −453.28991 | 30.000 | SiO2 |
| 23 | | 246.3 | −218.70337 | 1.000 | |
| 24 | | 275.8 | −4951.35296 | 57.003 | SiO2 |
| 25 | | 280.0 | −217.90659 | 1.000 | |
| 26 | | 280.0 | 285.85496 | 49.666 | SiO2 |
| 27 | | 277.1 | −1907.93638 | 1.000 | |
| 28 | | 254.9 | 304.90243 | 30.000 | SiO2 |
| 29 | | 249.0 | 1313.36200 | 1.000 | |
| 30 | | 223.4 | 231.71506 | 30.000 | SiO2 |

TABLE A-continued

| Surface Number | | Effective Diameter | Radius of Curvature | Surface Separation | Glass Type |
|---|---|---|---|---|---|
| 31 | ASP | 208.0 | 361.75424 | 2.705 | |
| 32 | | 204.2 | 419.23175 | 13.000 | SiO2 |
| 33 | | 172.2 | 148.21569 | 46.136 | |
| 34 | | 170.2 | −226.97976 | 13.000 | SiO2 |
| 35 | ASP | 155.1 | 134.52001 | 46.932 | |
| 36 | | 155.6 | −160.05070 | 13.000 | SiO2 |
| 37 | | 175.8 | 1096.12398 | 27.414 | |
| 38 | | 181.3 | −233.42897 | 29.001 | SiO2 |
| 39 | | 198.3 | −181.92265 | −0.234 | |
| 40 | STOP | 221.3 | ∞ | 1.234 | |
| 41 | ASP | 242.6 | 738.67490 | 46.969 | SiO2 |
| 42 | | 247.4 | −296.57723 | 1.000 | |
| 43 | | 270.3 | 403.01957 | 57.460 | SiO2 |
| 44 | | 270.7 | −391.65876 | 39.834 | |

TABLE A-continued

| Surface Number | | Effective Diameter | Radius of Curvature | Surface Separation | Glass Type |
|---|---|---|---|---|---|
| 45 | | 265.8 | −203.71190 | 19.000 | SiO2 |
| 46 | | 278.2 | −303.46148 | 8.949 | |
| 47 | | 280.0 | 560.59801 | 30.000 | SiO2 |
| 48 | | 278.0 | 10237.73553 | 1.000 | |
| 49 | | 271.2 | 308.20031 | 30.000 | SiO2 |
| 50 | | 267.4 | 953.67033 | 1.000 | |
| 51 | | 249.4 | 211.61929 | 29.160 | SiO2 |
| 52 | | 242.3 | 375.54148 | 1.000 | |
| 53 | | 222.7 | 173.49076 | 44.672 | SiO2 |
| 54 | | 213.5 | 1516.75806 | 50.000 | |
| 55 | ASP | 125.3 | −3574.40593 | 13.000 | SiO2 |
| 56 | | 98.2 | 91.30479 | 1.000 | |
| 57 | | 95.7 | 76.35234 | 45.000 | SiO2 |
| 58 | | 66.6 | 760.08315 | 15.000 | |

In the Table A, $SiO_2$ is synthetic quartz, and its refractive index to the light having a wavelength of 248 nm is 1.50839. "ASP" denotes a rotationally symmetrical aspheric surface, and has a surface shape defined by the following equation, where "z" is a displacement in the z-axis direction, "h" is a variable expressed by $\sqrt{(x^2+y^2)}$, "R" is a radius of curvature at a surface vertex, "k" is a conic coefficient, and "A-D" are aspheric coefficients.

$$z = \frac{h^2/R}{1+\sqrt{1-(1+k)h^2/R^2}} + Ah^4 + Bh^6 + Ch^8 + Dh^{10} \qquad \text{EQUATION 5}$$

Table 1 shows the conic coefficient k and the aspheric coefficients A to D of the rotationally symmetrical aspheric surface:

TABLE 1

| Surface Number | K | A | B | C | D |
|---|---|---|---|---|---|
| 8 | 0.16050 | 7.92822E−09 | −4.35365E−13 | −1.06805E−19 | −1.60548E−22 |
| 19 | 1.00000 | 4.36130E−08 | −2.78749E−13 | −3.80445E−17 | 4.49219E−22 |
| 31 | −0.34166 | −1.43383E−08 | −4.26300E−14 | −2.54398E−17 | −1.08650E−21 |
| 35 | 0.08142 | 2.44893E−08 | −4.44029E−12 | −7.51128E−17 | 1.32959E−20 |
| 41 | 0.90407 | 9.55672E−09 | −1.20116E−13 | 9.34509E−19 | 1.82120E−22 |
| 55 | 1.00000 | −1.22421E−07 | −1.01104E−12 | 8.35221E−16 | −4.27343E−20 |

In the Table A, "XY" denotes a rotationally asymmetrical aspheric surface having a surface shape expressed by the x and y power polynomial. "STOP" in the Table A denotes a stop surface.

The movement member 1 has an aspheric surface on the original side, and its aspheric surface f is given by the following equation:

$$f(x,y) = 5.0e-7 \cdot y^3 \qquad \text{EQUATION 6}$$

Since the movement member 1 has an effective diameter of Φ177.3 mm, a displacement amount of the aspheric surface is about 350 μm relative to the base plane. When the movement member 1 is parallel moved in a direction parallel to the y axis, the rotationally asymmetric distortion occurs which provides a magnification component in the y direction while maintaining the magnification in the x direction.

This embodiment provides an effective correction utilizing an optical means that has a small aspheric amount because an amount of rotationally asymmetrical distortion is small which occurs due to the absorption of the exposure light. Since the movement member 1 of this embodiment has a small displacement amount of the aspheric amount, this embodiment corrects the distortion and restrains the influence on the other optical characteristics.

The correction member 2 is distant from the movement member 1 by 100 μm, and fixed on the optical axis. The correction member 2 has an aspheric surface on the substrate side, whose aspheric surface g is provided by the following equation:

$$g(x,y)=1.2394e-09 \cdot y^2+5.0188e-07 \cdot y^3-3.0435e-13 \cdot y^4 \quad \text{EQUATION 7}$$

Figure 3:
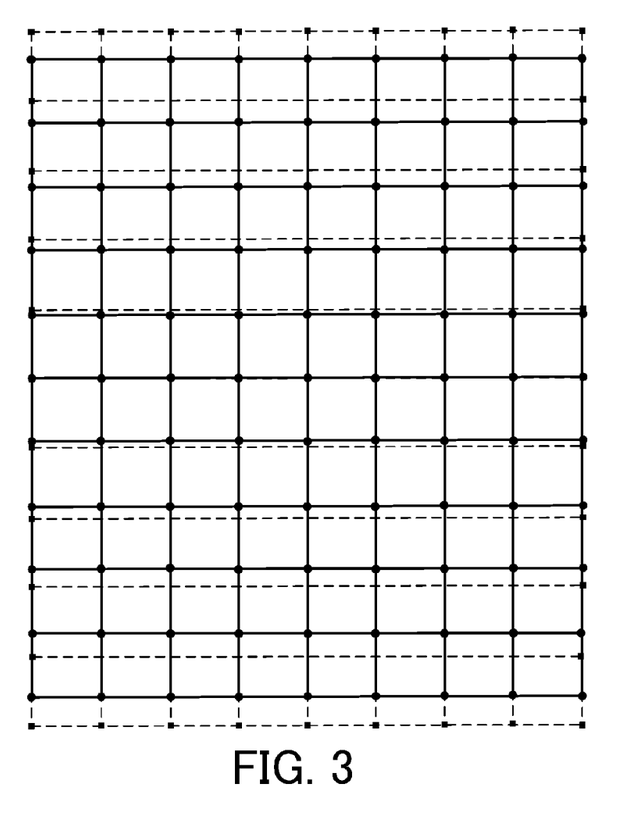
FIG. 3 is a view showing a distortion variation of a comparative example 1.

Thereby, the aberration resulting from the aspheric surface of the movement member 1 can be properly corrected. The aberration correction effect of the correction member 2 will be discussed below:

FIG. 3 is a view showing a distortion variation that occurs in a comparative example 1 (or in the Alvarez lens) in which the movement member and the correction member have complement aspheric surfaces. The aspheric surface of the movement member 1 is the same as that of this embodiment. The "distortion variation" means a difference between the distortion when none of the movement member 1 and the correction member has an aspheric surface, and the distortion when an aspheric surface is added to each of them. A grating shown by a dotted line is an ideal grating, and a grating shown by a solid line is a grating that contains the distortion. In order to clarify the shape, the distortion is enlarged by 20,000 times. Nine times eleven grating evaluation points are set in the rectangular exposure area of 26 mm×33 mm.

In FIG. 3, the distortion with a maximum value of 85.1 nm occurs in the screen. Since this distortion has a rotationally asymmetrical distortion shape and is different from a component that occurs due to decentering of a lens, it is therefore difficult to remove this distortion through a decentering adjustment of the projection optical system. Such a large amount of distortion lowers the overlay accuracy.

Figure 4:
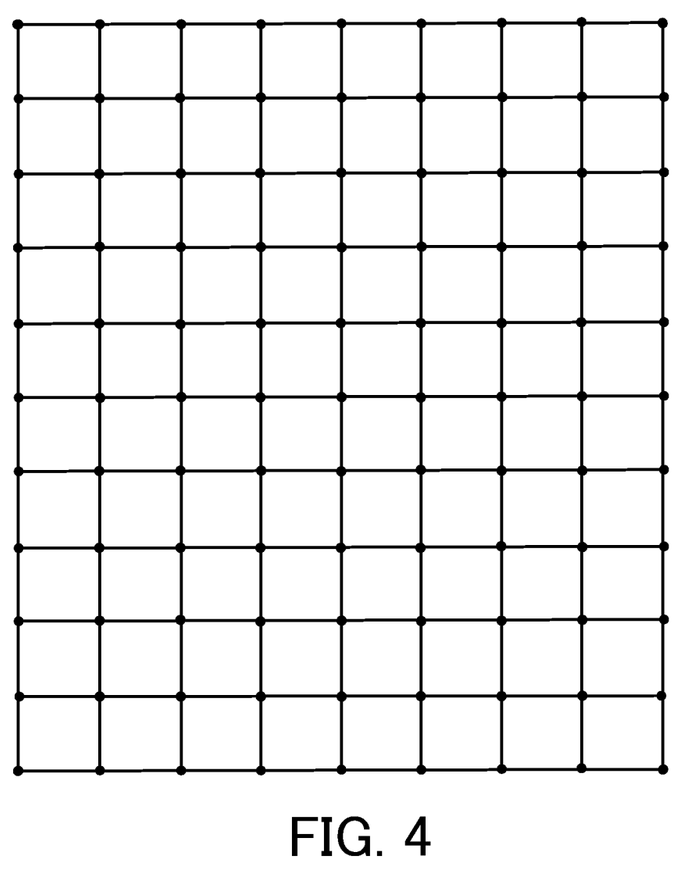
FIG. 4 is a view showing a distortion variation of the first embodiment.

FIG. 4 is a view showing a distortion variation of the projection optical system 4 shown in FIG. 2 which includes the movement member having an aspheric surface expressed by the Equation 6 and the correction member 2 having an aspheric surface expressed by the Equation 7. The evaluation points and the plot magnification of the distortion are similar to those of FIG. 3. In FIG. 4, the distortion has a maximum value of 0.45 nm in the screen, and is well restrained because it is much smaller than that shown in FIG. 3 by two figures.

Figure 5:
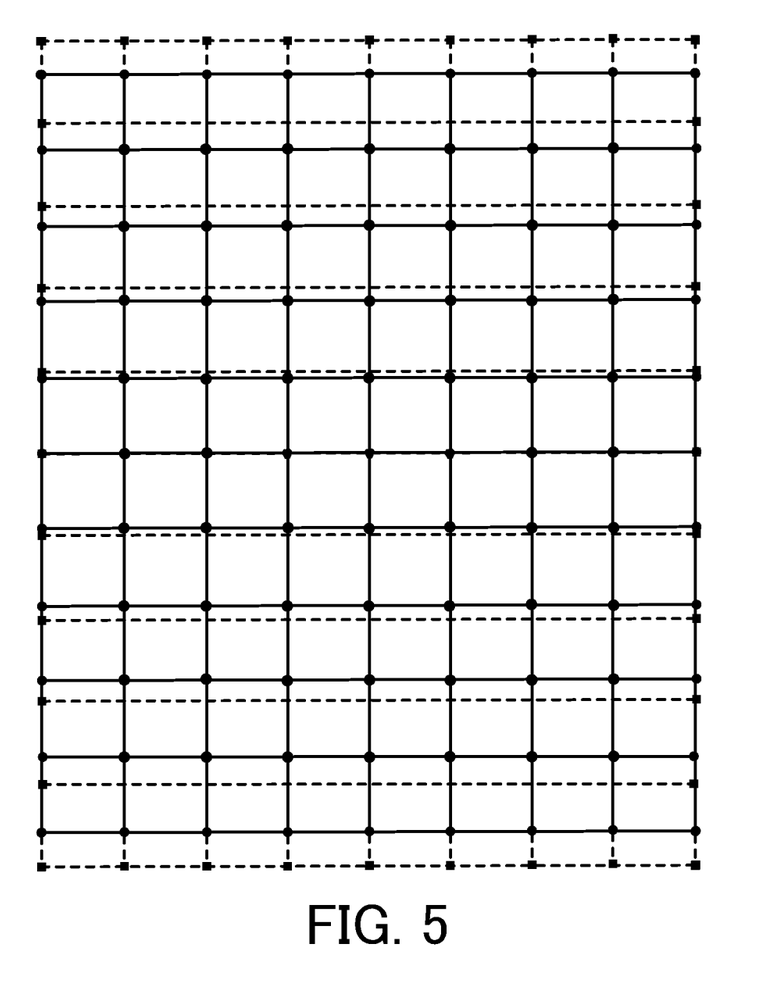
FIG. 5 is a view showing a distortion variation when a movement member is moved in FIG. 4.

FIG. 5 is a view showing a distortion variation when the movement member 1 is moved by +100 μm parallel to the y axis in the projection optical system 4 in FIG. 4. The "distortion variation" is a difference between the distortion before the movement member 1 is moved and the distortion after the movement member 1 is moved. The evaluation points and the plot magnification of the distortion are similar to those of FIG. 3.

According to FIG. 5, the grating shrinks only in the y direction and maintains in the x direction, causing a rotationally asymmetrical magnification component. By dissolving this grating into components, it is understood that there are a rotationally symmetrical magnification component of −2.06 ppm and an aspect ratio difference component of 2.06 ppm. The residual component other than these components is as small as 1.1 nm.

Since the order of the aspect ratio difference component that occurs as a result of that the projection optical system 4 absorbs the exposure light is as small as several ppm although it depends upon the exposure wavelength and the illumination mode, an aberration correction stroke necessary to correct a thermal aberration can be obtained by moving the movement member 1 by about ±several hundreds of micrometers. In addition, the residual component is sufficiently small and the influence upon the overlay accuracy is small.

Figure 6:
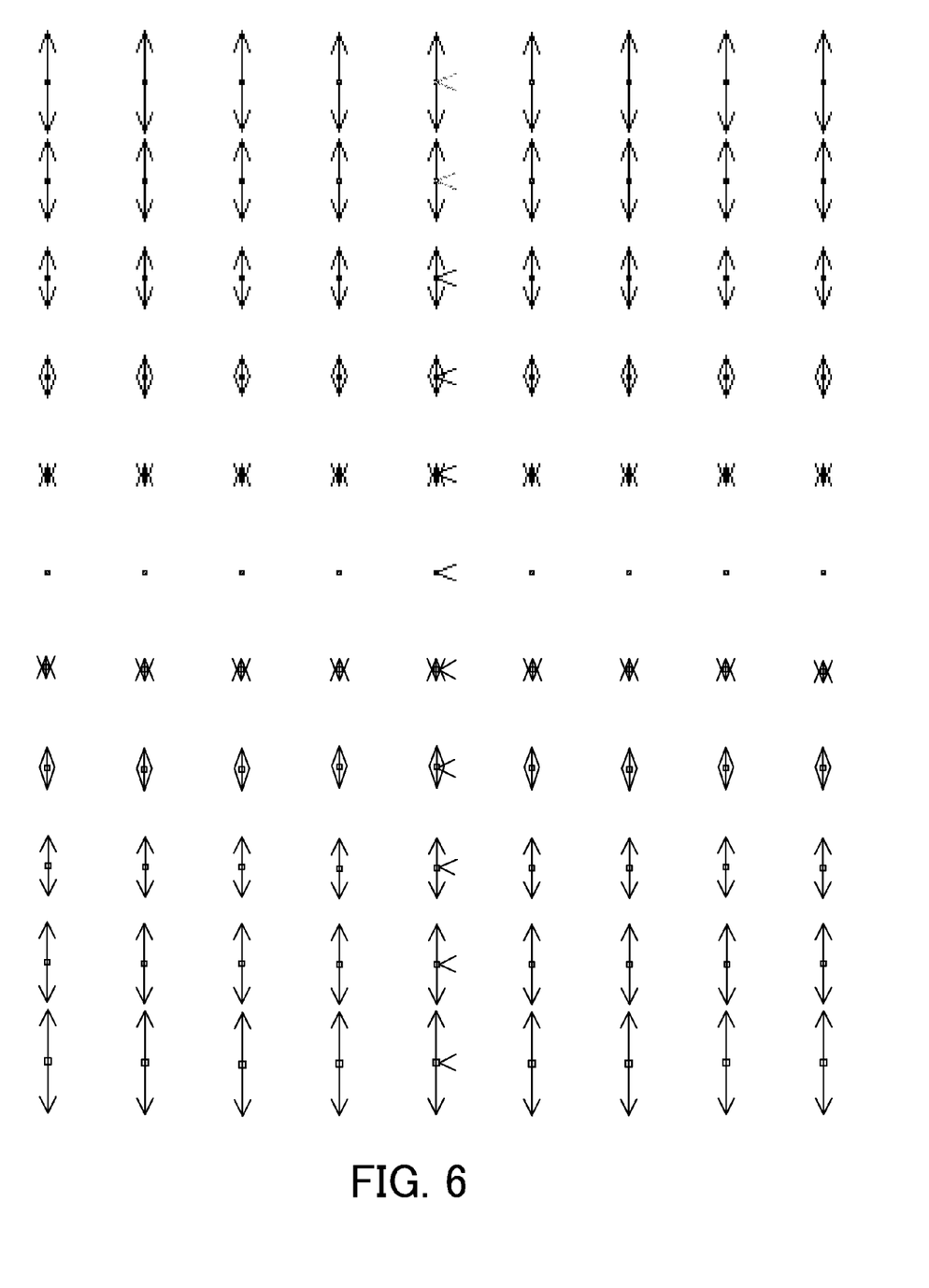
FIG. 6 is a view showing a focus variation of the comparative example 1 shown in FIG. 3.

FIG. 6 is a view showing a focus variation of the comparative example shown in FIG. 3. The "focus variation" is a difference between the focus when none of the movement member and the correction member has an aspheric surface and the focus when an aspheric surface is added to each of them.

In FIG. 6, a direction of an arrow indicates a direction in which the diffracted light moves which is caused by the reticle pattern, and a size of the arrow indicates a defocus size. For example, a vertical arrow indicates a focus shift relative to a horizontal pattern, and a lateral arrow indicates a focus shift relative to a vertical pattern. A thick arrow indicates that the focus shifts in the positive direction whereas a light arrow indicates that the focus shifts in the negative direction. An arrangement of the evaluation points is the same as that of the distortion. In FIG. 6, the focus shift of PV of 69.9 nm or the image plane width occurs in the screen, remarkably reducing the process allowance.

Figure 7:
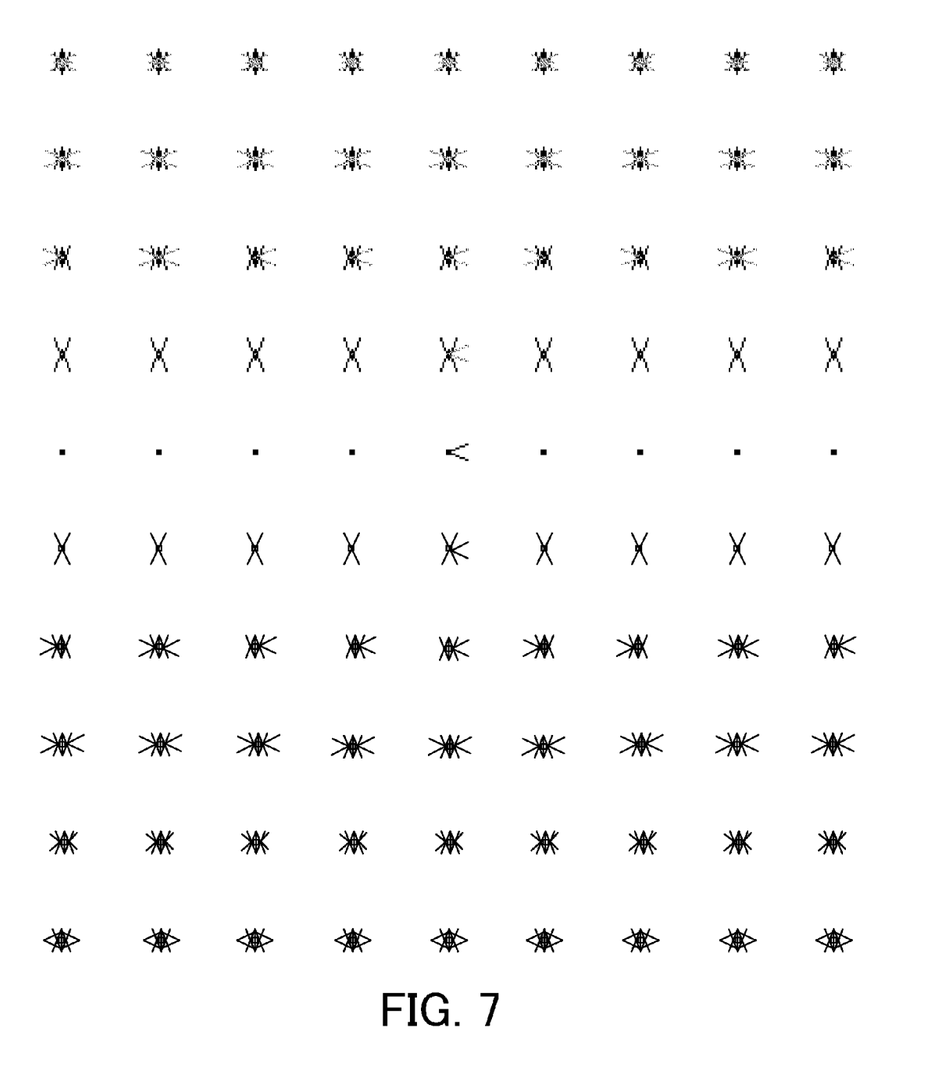
FIG. 7 is a view showing a focus variation of the first embodiment shown in FIG. 4.

FIG. 7 is a view showing a focus variation corresponding to the projection optical system of FIG. 4. The evaluation points and the plot magnification of the distortion are similar to those of FIG. 6. In FIG. 7, an amount of image plane width is PV of 22.9 nm in the screen, which is about one third as large as that of FIG. 6, reducing the influence on the process allowance.

Second Embodiment

Figure 8:
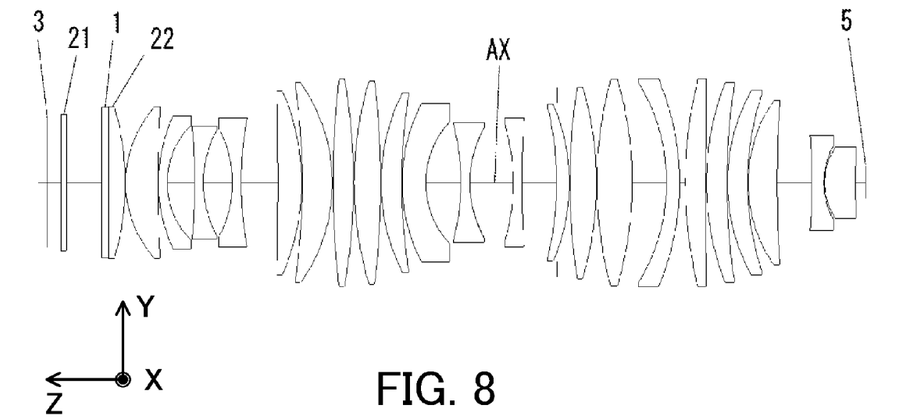
FIG. 8 is a sectional view of another specific structural illustration of a plurality of optical elements applicable to the projection optical system shown in FIG. 1 (second embodiment).

FIG. 8 is a sectional view of a specific structure (second embodiment) of a plurality of optical elements included in the projection optical system 4. This embodiment provides two correction members 21 and 22. The projection optical system 4 of the second embodiment is used for a light source of a KrF excimer laser having a wavelength of 248 nm, and has a NA of 0.60 and a projection magnification of −¼ times. The substrate 5 has a rectangular exposure area of 26×33 mm. Table B shows an effective diameter, a radius of curvature, a surface separation, and a glass type of each surface of the projection optical system 4.

TABLE B

| Surface Number | | Effective Diameter | Radius of Curvature | Surface Separation | Glass Type |
|---|---|---|---|---|---|
| 1 | | 168.4 | ∞ | 20.000 | |
| 2 | XY | 174.6 | ∞ | 8.000 | SiO2 |
| 3 | | 176.2 | ∞ | 51.900 | |
| 4 | | 192.3 | ∞ | 10.000 | SiO2 |
| 5 | XY | 194.3 | ∞ | 0.100 | |
| 6 | XY | 194.3 | ∞ | 24.000 | SiO2 |
| 7 | | 196.1 | −317.74375 | 1.000 | |
| 8 | ASP | 195.0 | 128.82373 | 47.208 | SiO2 |
| 9 | | 189.9 | 1321.21173 | 1.000 | |
| 10 | | 172.0 | 180.93016 | 13.000 | SiO2 |
| 11 | | 146.9 | 95.53455 | 39.689 | |
| 12 | | 146.1 | −823.63969 | 13.000 | SiO2 |
| 13 | | 138.2 | 126.92359 | 42.560 | |
| 14 | | 138.9 | −129.87630 | 13.000 | SiO2 |
| 15 | ASP | 165.5 | 430.92363 | 53.786 | |
| 16 | | 229.6 | −4569.07475 | 34.601 | SiO2 |
| 17 | | 236.6 | −263.60528 | 1.000 | |
| 18 | | 251.9 | −770.76064 | 44.163 | SiO2 |
| 19 | | 257.0 | −200.73376 | 1.000 | |

TABLE B-continued

| Surface Number | | Effective Diameter | Radius of Curvature | Surface Separation | Glass Type |
|---|---|---|---|---|---|
| 20 | | 267.7 | 1012.66170 | 30.000 | SiO2 |
| 21 | | 268.0 | −691.18493 | 1.000 | |
| 22 | | 262.5 | 397.75217 | 38.700 | SiO2 |
| 23 | | 259.9 | −1007.78240 | 1.000 | |
| 24 | | 232.5 | 229.67477 | 30.000 | SiO2 |
| 25 | | 225.3 | 619.90604 | 1.000 | |
| 26 | | 204.4 | 198.24797 | 34.502 | SiO2 |
| 27 | ASP | 157.4 | 105.09593 | 51.378 | |
| 28 | | 154.1 | −265.65699 | 13.000 | SiO2 |
| 29 | ASP | 144.2 | 125.79300 | 63.614 | |
| 30 | | 153.0 | −239.33555 | 13.000 | SiO2 |
| 31 | | 165.1 | 1195.59834 | 50.868 | |
| 32 | | 193.6 | −364.86223 | 18.472 | SiO2 |
| 33 | | 202.4 | −229.11292 | −17.624 | |
| 34 | STOP | 203.7 | ∞ | 18.624 | |
| 35 | ASP | 242.6 | 832.43292 | 38.675 | SiO2 |
| 36 | | 246.8 | −389.09720 | 1.000 | |
| 37 | | 265.1 | 452.24289 | 51.780 | SiO2 |
| 38 | | 265.8 | −413.86377 | 50.112 | |
| 39 | | 258.5 | −221.49348 | 19.000 | SiO2 |
| 40 | | 268.0 | −307.14415 | 8.547 | |
| 41 | | 268.0 | 490.94417 | 30.000 | SiO2 |
| 42 | | 265.8 | 32409.69300 | 1.000 | |
| 43 | | 257.7 | 313.61137 | 30.000 | SiO2 |
| 44 | | 251.4 | 737.52560 | 1.000 | |
| 45 | | 237.5 | 220.30779 | 29.160 | SiO2 |
| 46 | | 225.6 | 316.96456 | 1.000 | |
| 47 | | 211.3 | 166.42979 | 42.603 | SiO2 |
| 48 | | 202.9 | 1595.28264 | 50.000 | |
| 49 | ASP | 122.8 | 21215.62844 | 18.539 | SiO2 |
| 50 | | 93.9 | 88.40230 | 1.000 | |
| 51 | | 91.6 | 73.90385 | 45.044 | SiO2 |
| 52 | | 62.8 | 401.14620 | 15.000 | |

Those elements in the Table B, which are corresponding elements in the Table A, are designated by the same symbols. Table 2 indicates the conic coefficient k and aspheric coefficients A to D of ASP.

TABLE 2

| Surface Number | k | A | B | C | D |
|---|---|---|---|---|---|
| 8 | −0.29291 | 9.42140E−09 | 1.05843E−13 | 4.95453E−18 | 5.12198E−23 |
| 15 | 0.58103 | 2.92444E−08 | −3.07971E−12 | 9.24739E−17 | −7.49875E−22 |
| 27 | 0.01562 | −7.52995E−09 | −1.01425E−13 | 6.24821E−18 | 2.12781E−22 |
| 29 | −0.78067 | 4.35317E−08 | −4.10494E−12 | −1.97042E−16 | 2.08866E−20 |
| 35 | 0.05901 | 9.53367E−09 | −1.21552E−13 | −1.20596E−18 | 1.08517E−22 |
| 49 | 1.00000 | −1.42543E−07 | 1.93363E−13 | 8.12052E−16 | −4.46724E−20 |

The movement member 1 has an aspheric surface on the substrate side, whose aspheric surface f is given by the following equation:

$$f(x,y) = 3.5e\text{-}7 \cdot x^3 + 1.5e\text{-}11 \cdot y^5 \quad \text{EQUATION 8}$$

Since the movement member 1 has an effective diameter of Φ194.3 mm, a displacement amount of the aspheric surface is about 321 μm relative to the base plane. When the movement member 1 is parallel moved in a direction parallel to the x axis, the rotationally asymmetric distortion occurs which provides a magnification component in the x direction while maintaining the magnification in the y direction. When the movement member 1 is parallel moved in a direction parallel to the y axis, the rotationally asymmetric distortion proportional to a tertiary component of the image point occurs which provides a rotationally asymmetrical distortion proportional to the tertiary term of the image point in the y direction while maintaining the magnification in the x direction. When a parallel movement in the x-axis direction is combined with a parallel movement in the y-axis direction, a rotationally asymmetrical magnification and a rotationally asymmetrical distortion can be produced at an arbitrary ratio, and the degree of freedom of the distortion to be corrected becomes higher.

This embodiment also provides an effective correction utilizing an optical means that has a small aspheric amount because an amount of rotationally asymmetrical distortion is small which occurs due to the absorption of the exposure light. Since the movement member 1 of this embodiment has a small displacement amount of the aspheric amount, this embodiment corrects the distortion and restrains the influence on the other optical characteristics.

The correction member 21 is distant from the movement member 1 by 51.9 mm, and fixed on the optical axis. The correction member 21 has an aspheric surface on the substrate side, whose aspheric surface g is provided by the following equation:

$$g(x,y) = 7.0047e\text{-}10 \cdot x^3 + 2.2587e\text{-}13 \cdot x^5 - 9.6939e\text{-}18 \cdot x^7 + 7.0115e\text{-}14 \cdot y^5 + 3.0903e\text{-}18 \cdot y^7 \quad \text{EQUATION 9}$$

The correction member 22 is distant from the movement member 1 by 100 μm, and fixed on the optical axis. The correction member 22 has an aspheric surface on the original side, whose aspheric surface h is provided by the following equation:

$$h(x,y) = 3.4934e\text{-}7 \cdot x^3 - 3.8442e\text{-}14 \cdot x^5 + 1.3568e\text{-}18 \cdot x^7 + 1.4962e\text{-}11 \cdot y^5 - 4.4384e\text{-}19 \cdot y^7 \quad \text{EQUATION 10}$$

A correction member may use a member that has a power like the correction member 22.

Figure 9:
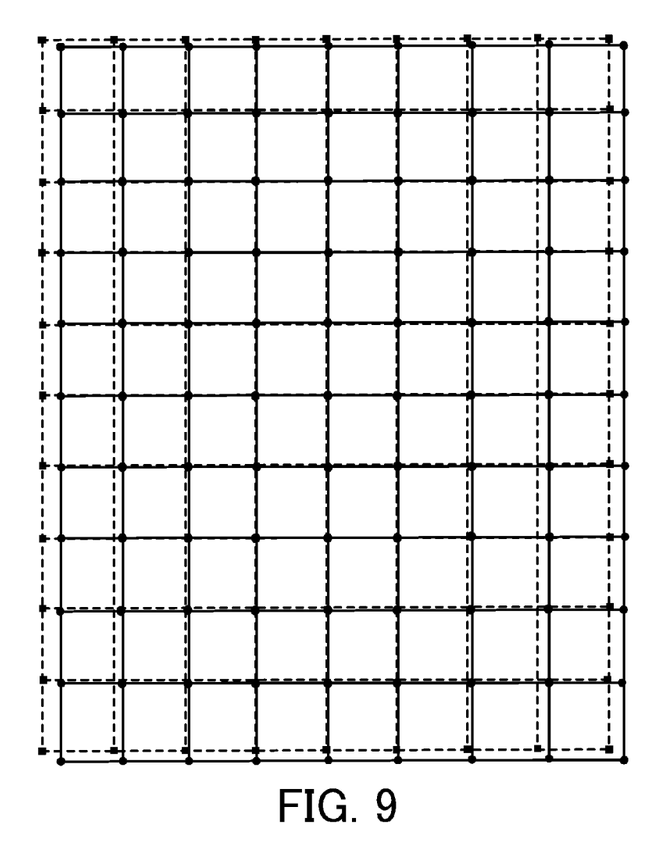
FIG. 9 is a view showing a distortion variation of a comparative example 2.

The aspheric surfaces of the correction members 21 and 22 can properly correct the aberration caused by the aspheric surface of the movement member 1. The aberration correction effect of these correction members 21 and 22 will be discussed below:

FIG. 9 is a view showing a distortion variation that occurs in a comparative example 2 (or Alvarez lens) in which the movement member 1 and the correction member 22 have complement aspheric surfaces. The aspheric surface of the movement member 1 is the same as that of this embodiment. A definition of the distortion variation is the same as that for FIG. 3.

A grating shown by a dotted line is an ideal grating, and a grating shown by a solid line is a grating that contains the distortion. In order to clarify the shape, the distortion is enlarged by 20,000 times. Nine times eleven grating evaluation points are set in a rectangular exposure area of 26 mm×33 mm.

In FIG. 9, the distortion with a maximum value of 38.3 nm occurs in the screen. Since this distortion has a rotationally asymmetrical distortion shape and is different from a component that occurs due to decentering of a lens, it is therefore difficult to remove this distortion through a decentering adjustment of the projection optical system. Such a large amount of distortion lowers the overlay accuracy.

Figure 10:
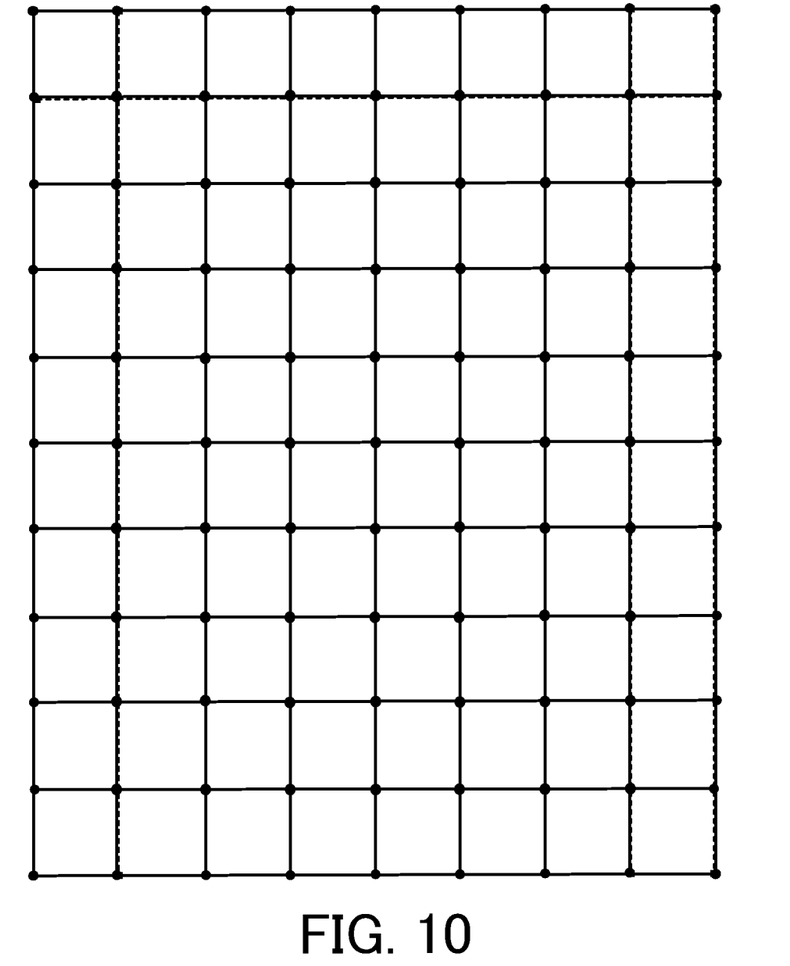
FIG. 10 is a view showing a distortion variation of the second embodiment.

FIG. 10 is a view showing a distortion variation of the projection optical system 4 shown in FIG. 8 which includes the movement member 1 having an aspheric surface expressed by the Equation 8, the correction member 21 having an aspheric surface expressed by the Equation 9, and the correction member 22 having an aspheric surface expressed by the Equation 10. The evaluation points and the plot magnification of the distortion are similar to those of FIG. 9. In FIG. 10, the distortion has a maximum value of 1.9 nm in the screen, and is well restrained because it is much smaller than that shown in FIG. 9 by one figure.

Figure 11:
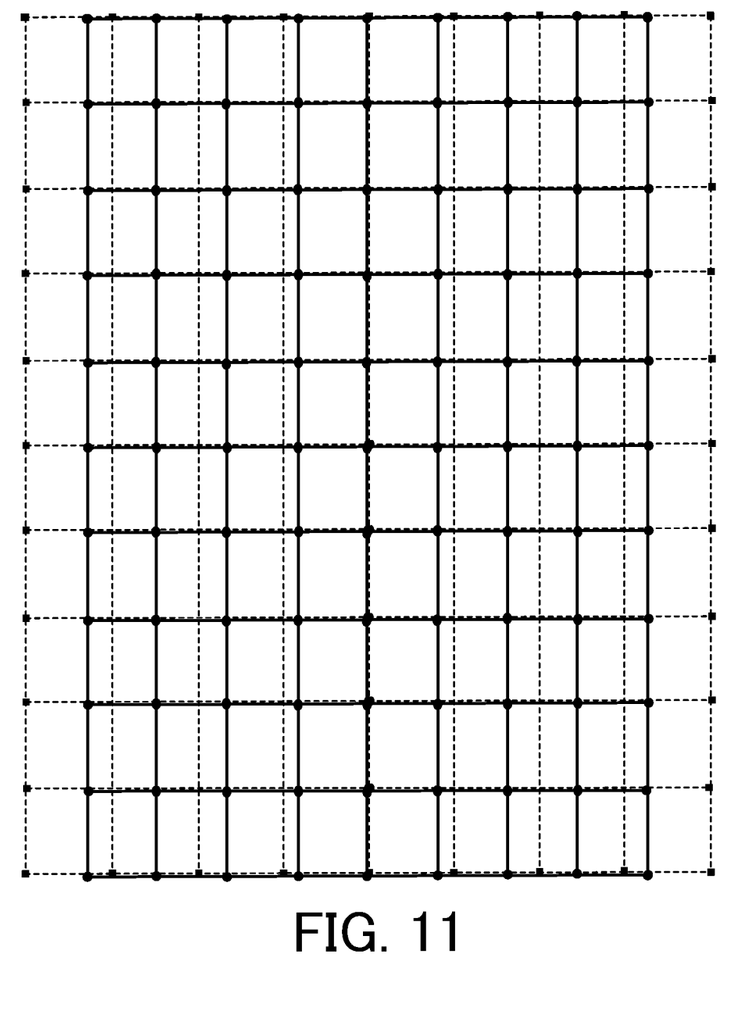
FIG. 11 is a view showing a distortion variation when a movement member is moved in the x direction in FIG. 10.
Figure 12:
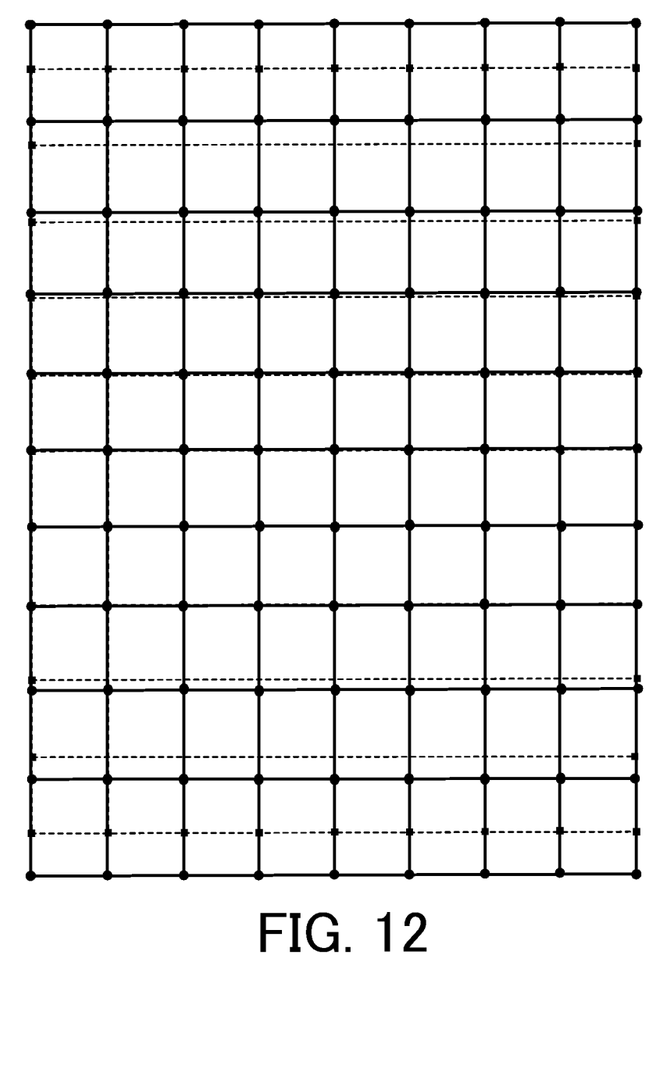
FIG. 12 is a view showing a distortion variation when the movement member is moved in the y direction in FIG. 10.

FIG. 11 is a view showing a distortion variation when the movement member 1 is moved by +100 μm parallel to the x axis in the projection optical system 4 in FIG. 10. FIG. 12 is a view showing a distortion variation when the movement member 1 is moved by +100 μm parallel to the y axis in the projection optical system 4 in FIG. 10. A definition of the distortion variation is the same as that shown in FIG. 5. The evaluation points and the plot magnification of the distortion are similar to those of FIG. 9.

According to FIG. 11, the grating shrinks only in the x direction and maintains in the y direction, causing a rotationally asymmetrical magnification component. By dissolving this grating into components, it is understood that there are a rotationally symmetrical magnification component of −4.50 ppm and an aspect ratio difference component of 4.51 ppm. The residual component other than these components is as small as 1.3 nm.

According to FIG. 12, the grating extends in the y direction in proportion to the tertiary term of the image point and maintains in the x direction, causing a rotationally asymmetrical distortion component. By dissolving this grating into components, it is understood that the tertiary distortion in the y direction of 93.6 nm occurs at the image point of 16.5 nm. The residual component other than these components is as small as 1.4 nm.

Since the order of the aspect ratio difference component that occurs as a result of that the projection optical system 4 absorbs the exposure light is as small as several ppm, and the order of the tertiary distortion component in the y direction is dozens of nanometers. Therefore, by moving the movement member 1 by about ±several hundreds of micrometers in the x and y directions, an aberration correction stroke necessary to correct a thermal aberration can be obtained. In addition, the residual component is sufficiently small and the influence upon the overlay accuracy is small.

Figure 13:
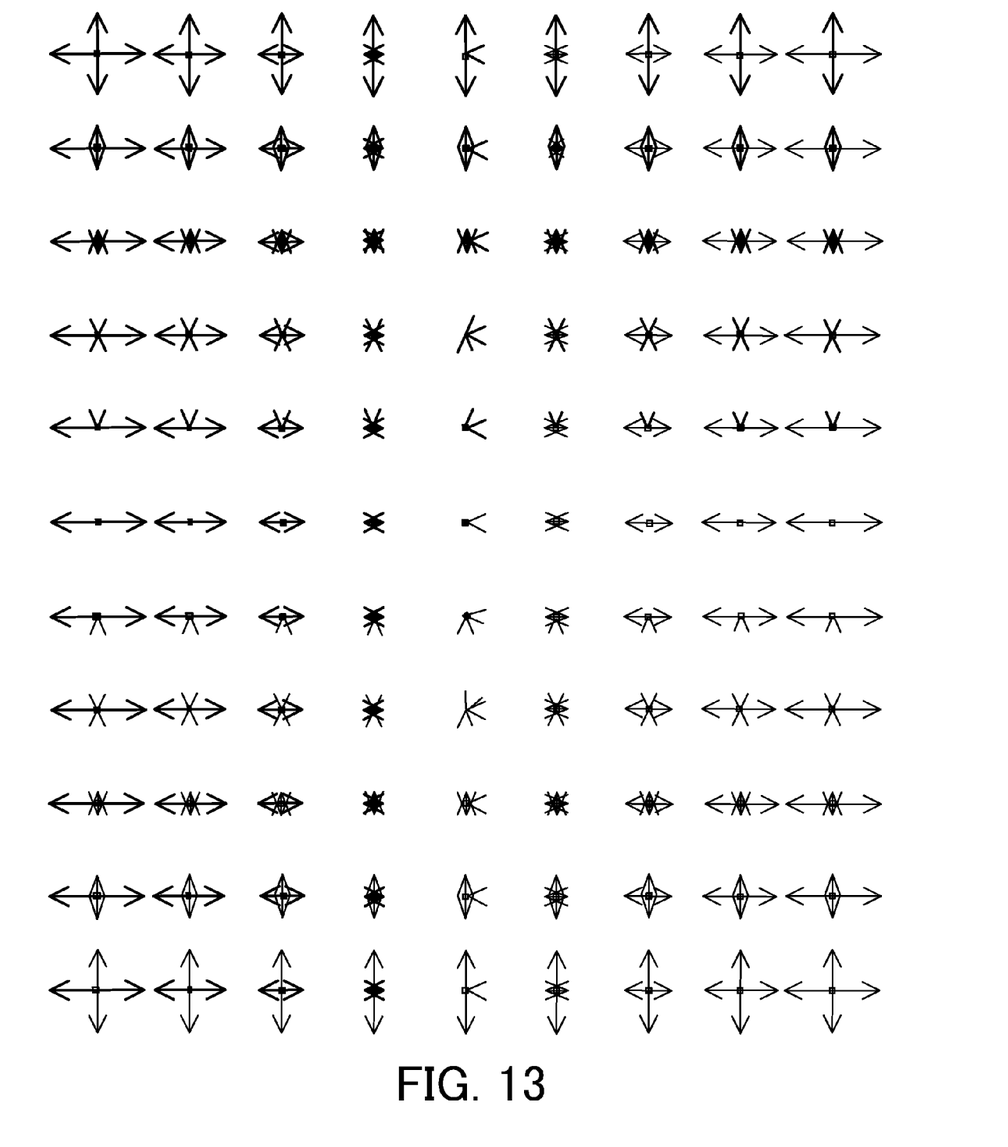
FIG. 13 is a view showing a focus variation of the comparative example 2.

FIG. 13 is a view showing a focus variation of the comparative example 2 shown in FIG. 9. A definition of the focus variation, meanings of the arrow direction and size and arrow color, and an arrangement of the evaluation points are the same as those for FIG. 6. In FIG. 13, the focus shift of PV of 120.7 nm or the image plane width occurs in the screen, remarkably reducing the process allowance.

Figure 14:
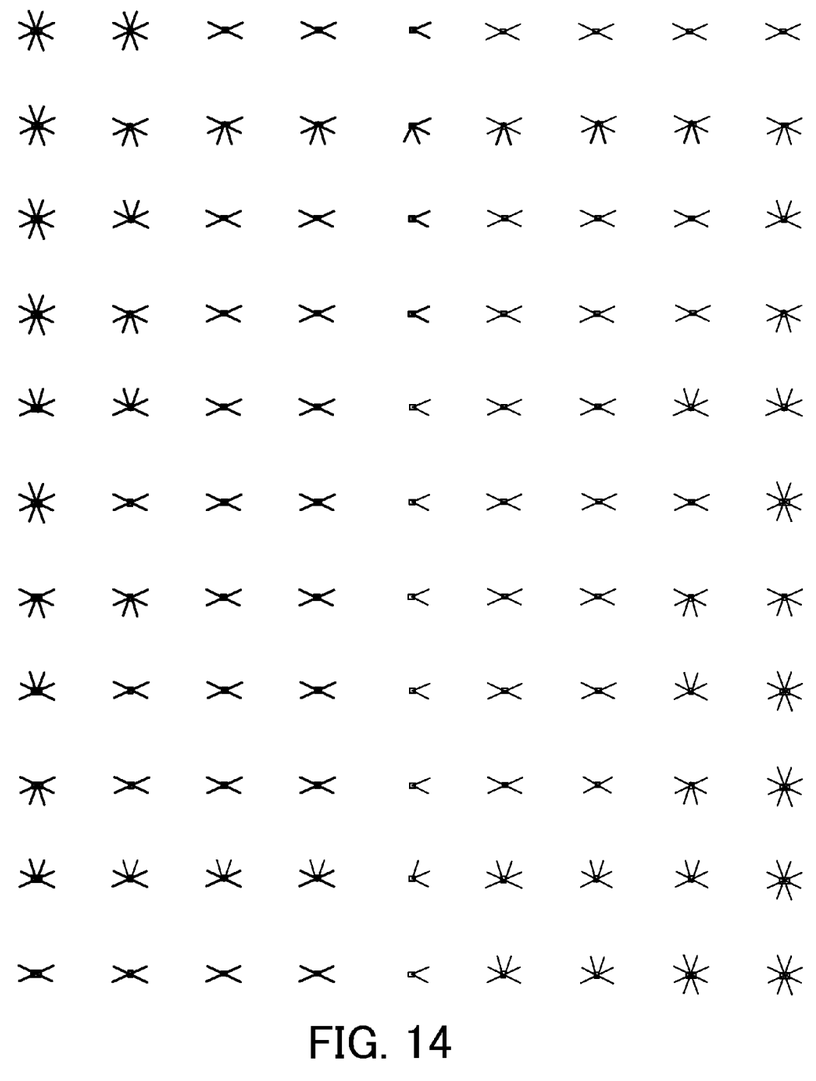
FIG. 14 is a view showing a focus variation of the second embodiment.

FIG. 14 shows a focus variation corresponding to the projection optical system shown in FIG. 10. The evaluation points, distortion, and plot magnification are similar to those of FIG. 13. In FIG. 14, an amount of the image plane width is PV of 13.7 nm in the screen, which is more improved than that of FIG. 13, reducing the influence to the process allowance degree.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The projection optical system is applicable to an application of projecting an image on an object plane onto an image plane. The exposure apparatus is applicable to an application of manufacturing a device.

This application claims the benefit of Japanese Patent Application No. 2009-054815, filed Mar. 9, 2009, which is hereby incorporated by reference herein in its entirety.

What is claimed is:

1. A projection optical system configured to project an image of an object plane onto an image plane, said projection optical system comprising:
   a first optical element having an aspheric surface that is rotationally asymmetric with respect to an optical axis;
   a moving unit configured to move the first optical element in a direction perpendicular to the optical axis; and
   a second optical element having an aspheric surface and fixed on the optical axis,
   wherein the aspheric surface of the second optical element is configured to reduce an aberration due to the aspheric surface of the first optical element when the first optical element is located at a predetermined position,
   wherein the first optical element corrects an aberration of the projection optical system by moving away from the predetermined position in the direction perpendicular to the optical axis, and
   wherein the aspheric surface of the second optical element is not complementary to the aspheric surface of the first optical element.

2. The projection optical system according to claim 1, wherein the first optical element is adjacent to the second optical element.

3. The projection optical system according to claim 1, wherein:
   the first optical element is arranged close to the object plane, and
   the first optical element adjusts a magnification or a distortion.

4. The projection optical system according to claim 1, wherein:
   the first optical element is arranged close to the image plane, and
   the first optical element adjusts at least one of a magnification, a distortion, a spherical aberration, or an astigmatism.

5. An exposure apparatus comprising:
   a projection optical system configured to project an image of an original plane onto a substrate plane,
   wherein the projection optical system comprises:
   a first optical element having an aspheric surface that is rotationally asymmetric with respect to an optical axis;
   a moving unit configured to move the first optical element in a direction perpendicular to the optical axis; and
   a second optical element having an aspheric surface and fixed on the optical axis,
   wherein the aspheric surface of the second optical element is configured to reduce an aberration due to the aspheric surface of the first optical element when the first optical element is located at a predetermined position,
   wherein the first optical element corrects an aberration of the projection optical system by moving away from the predetermined position in the direction perpendicular to the optical axis, and
   wherein the aspheric surface of the second optical element is not complementary to the aspheric surface of the first optical element.

6. A device manufacturing method comprising the steps of:
   exposing a substrate using an exposure apparatus; and developing the substrate that has been exposed,
wherein the exposure apparatus includes a projection optical system configured to project an image of an original plane onto a substrate plane,
wherein the projection optical system comprises:
a first optical element having an aspheric surface that is rotationally asymmetric with respect to an optical axis;
a moving unit configured to move the first optical element in a direction perpendicular to the optical axis; and
a second optical element having an aspheric surface and fixed on the optical axis,
wherein the aspheric surface of the second optical element is configured to reduce an aberration due to the aspheric surface of the first optical element when the first optical element is located at a predetermined position,
wherein the first optical element corrects an aberration of the projection optical system by moving away from the predetermined position in the direction perpendicular to the optical axis, and
wherein the aspheric surface of the second optical element is not complementary to the aspheric surface of the first optical element.

7. A projection optical system comprising:
a first optical element having an aspheric surface that is rotationally asymmetric with respect to an optical axis of the projection optical system; and
a second optical element having an aspheric surface that is not complementary to the aspheric surface of the first optical element,
wherein the aspheric surface of the second optical element is configured to reduce an aberration due to the aspheric surface of the first optical element when the first optical element is located at a predetermined position, and
wherein the first optical element corrects an aberration of the projection optical system by moving away from the predetermined position in a direction perpendicular to the optical axis.

8. The projection optical system according to claim 7, wherein the first optical element is adjacent to the second optical element.

9. The projection optical system according to claim 7, wherein:
the first optical element is arranged close to an object plane, and
the first optical element adjusts a magnification or a distortion.

10. The projection optical system according to claim 7, wherein:
the first optical element is arranged close to an image plane of the projection optical system, and
the first optical element adjusts at least one of a magnification, a distortion, a spherical aberration, or an astigmatism.

11. An exposure apparatus comprising:
a projection optical system configured to project an image of an original onto a substrate,
wherein the projection optical system comprises:
a first optical element having an aspheric surface that is rotationally asymmetric with respect to an optical axis of the projection optical system; and
a second optical element having an aspheric surface that is not complementary to the aspheric surface of the first optical element,
wherein the aspheric surface of the second optical element is configured to reduce an aberration due to the aspheric surface of the first optical element when the first optical element is located at a predetermined position, and
wherein the first optical element corrects an aberration of the projection optical system by moving away from the predetermined position in a direction perpendicular to the optical axis.

12. A device manufacturing method comprising the steps of:
exposing a substrate using an exposure apparatus; and
developing the substrate that has been exposed,
wherein the exposure apparatus includes a projection optical system configured to project an image of an original onto a substrate,
wherein the projection optical system comprises:
a first optical element having an aspheric surface that is rotationally asymmetric with respect to an optical axis of the projection optical system; and
a second optical element having an aspheric surface that is not complementary to the aspheric surface of the first optical element,
wherein the aspheric surface of the second optical element is configured to reduce an aberration due to the aspheric surface of the first optical element when the first optical element is located at a predetermined position, and
wherein the first optical element corrects an aberration of the projection optical system by moving away from the predetermined position in a direction perpendicular to the optical axis.

* * * * *